United States Patent
Oh et al.

(10) Patent No.: US 7,298,204 B2
(45) Date of Patent: Nov. 20, 2007

(54) METHOD AND APPARATUS FOR OUTPUTTING AUDIO SIGNAL

(75) Inventors: Jong Hoon Oh, Seoul (KR); Min Ki Yang, Seoul (KR); Il Suk Ko, Gimpo-si (KR)

(73) Assignee: Pulsus Technologies, Seoul (KR)

( * ) Notice: Subject to any disclaimer, the term of this patent is extended or adjusted under 35 U.S.C. 154(b) by 0 days.

(21) Appl. No.: 11/589,616

(22) Filed: Oct. 30, 2006

(65) Prior Publication Data

US 2007/0120596 A1     May 31, 2007

(30) Foreign Application Priority Data

Nov. 30, 2005  (KR) .................... 10-2005-0115396
Feb. 3, 2006   (KR) .................... 10-2006-0010448

(51) Int. Cl.
    *H03F 3/38*    (2006.01)
(52) U.S. Cl. ........................ 330/10; 330/149
(58) Field of Classification Search ............. 330/10, 330/149
    See application file for complete search history.

(56) References Cited

U.S. PATENT DOCUMENTS

| 5,150,072 | A  | * | 9/1992  | Malec ........................ 330/149 |
| 5,381,109 | A  | * | 1/1995  | Cripe et al. .................. 330/10 |
| 5,559,467 | A  |   | 9/1996  | Smedley |
| 6,466,087 | B2 | * | 10/2002 | Ruha .......................... 330/10 |
| 6,518,838 | B1 | * | 2/2003  | Risbo ......................... 330/10 |
| 6,943,620 | B2 | * | 9/2005  | Andersen et al. ............. 330/10 |
| 7,239,200 | B2 | * | 7/2007  | Ishii et al. .................... 330/10 |

FOREIGN PATENT DOCUMENTS

| KR | 10-2005-0003647 | 1/2005 |
| KR | 10-2005-0034095 | 4/2005 |

* cited by examiner

*Primary Examiner*—Patricia Nguyen
(74) *Attorney, Agent, or Firm*—Ditthavong Mori & Steiner, P.C.

(57) ABSTRACT

A method and an apparatus for outputting an audio signal are provided. The apparatus includes a power source; a compensator for compensating an input signal by adding the input signal to an offset value reciprocally proportional to a source voltage; a pulse width modulator for modulating an audio signal transmitted from the compensator; and an output stage for outputting the modulated audio signal. Accordingly, audio quality can be improved directly for a listener by compensating the input signal damaged by periodical voltage drops.

24 Claims, 6 Drawing Sheets

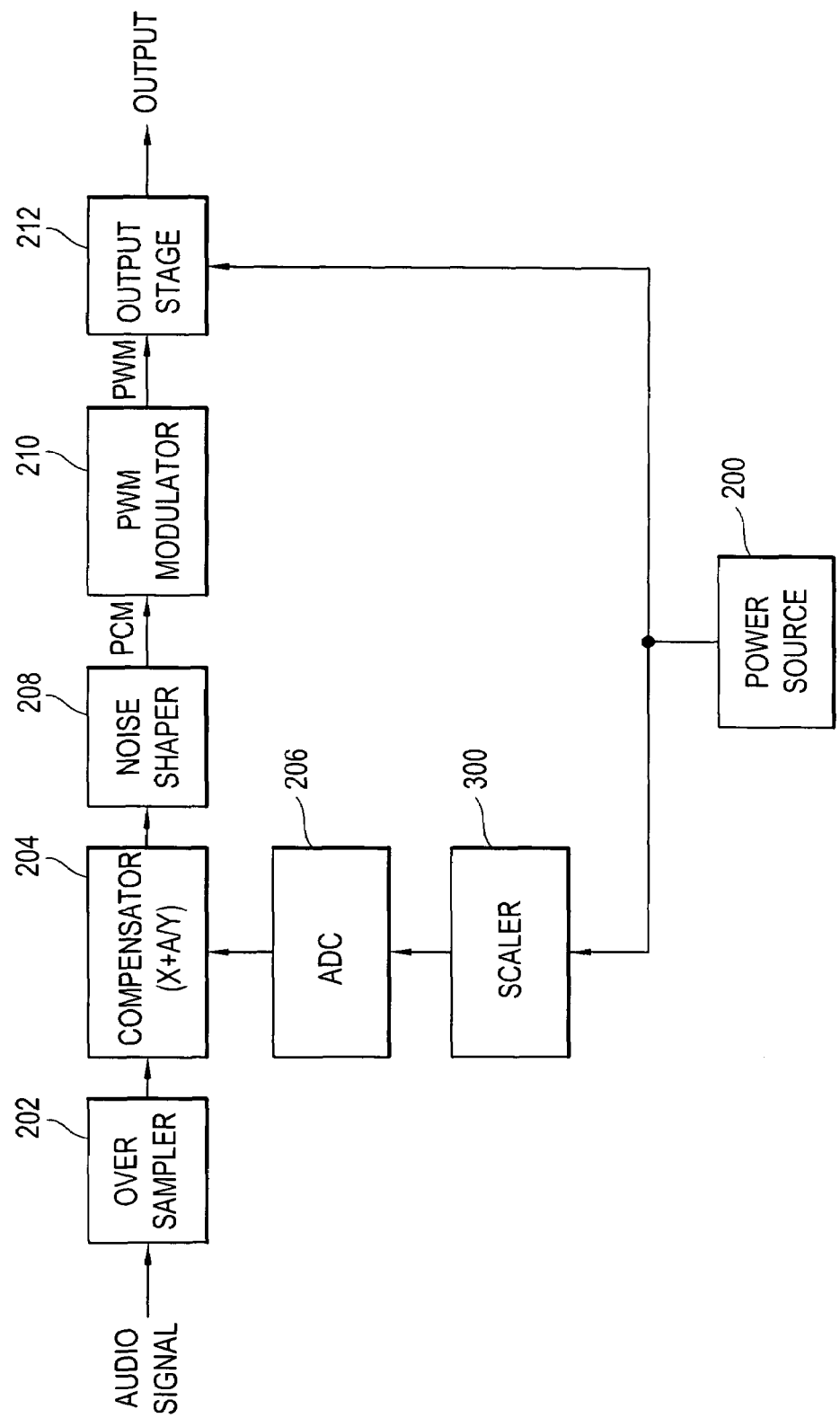

METHOD AND APPARATUS FOR OUTPUTTING AUDIO SIGNAL

BACKGROUND

1. Technical Field

The present invention relates to a method and an apparatus for outputting an audio signal, and more particularly, to a method and an apparatus for outputting an audio signal capable of removing noise generated when the audio signal is generated.

2. Related Art

As techniques of processing a digital signal have been developed, a method of processing an audio signal that employs a digital processing technique has also been developed. In a method of outputting a digital audio signal, a method of converting an analogue audio signal into a digital signal includes a pulse code modulation method. In the PCM method, the audio signal is digitalized, transmitted and accumulated.

A digital audio power amplifier that employs a digital pulse width modulation (PWM) method is used to output the pulse code modulated audio signal obtained in the PCM method with high reliability.

The high reliability of the digital audio power amplifier using the PWM method depends on a high accuracy DC source. Accordingly, any ripple caused by the power source influences on the PWM digital audio power amplifier. That is, the output audio signal may be damaged by the ripple of the power source.

Therefore, methods for solving the aforementioned problem have been suggested. First, a method of compensating for a damage of an audio signal due to a ripple of a power source is disclosed in U.S. Pat. No. 5,559,467, entitled "Digital, Pulse width modulation audio power amplifier with noise and ripple shaping" issued to Smedley. As disclosed in the U.S. Patent issued to Smedley, a divider outputs a value obtained by dividing an audio input signal x, which is over sampled and transmitted, by a source signal y. The source signal y is converted into a digital source signal by an analogue to digital (AD) converter and supplied, thereby generating the ripple.

That is, a relation z=x/y is satisfied. However, the PWM signal increases or decreases depending on a duty ratio with respect to the PCM signal that is the input signal x, and the duty ratio is non-zero during a PWM operation. However, the aforementioned equation suggested by Smedley does not consider the duty ratio of the PWM.

Accordingly, perfect compensation with respect to the PWM value cannot be obtained according to the U.S. Patent issued to Smedley.

There are practical problems caused by the source ripple in various fields in which the apparatus for outputting a digital audio signal is used. In a TDMA transmission method that is one of multiple access methods in mobile communication networks, a voltage drop due to a TDMA burst periodically occurs, thereby generating noise in an output audio signal.

To solve the problem, there is provided a technique. The technique is disclosed in Korean Patent Application No.2005-0003647 entitled "Method of removing noise from communication terminal" filed by Woongkil Choi. As disclosed in the Korean Patent Application, audio output noise is removed by applying an offset voltage during a burst period to reduce a battery voltage drop.

However, in the Korean Patent Application, only a source voltage drop is compensated, and however, the noise caused by the TDMA burst ripple is not prevented from being introduced into the audio output signal.

SUMMARY

The present invention provides a method and an apparatus for outputting an audio signal capable of removing noise of the audio signal caused by voltage drops.

According to an aspect of the present invention, there is provided an apparatus for outputting an audio signal comprising: a power source; a compensator for compensating an input signal by adding the input signal to an offset value reciprocally proportional to a source voltage; a pulse width modulator for modulating an audio signal transmitted from the compensator; and an output stage for outputting the modulated audio signal.

According to another aspect of the present invention, there is provided a method of outputting an audio signal, the method comprising steps of: compensating a signal by adding a value reciprocally proportional to a source voltage to an input signal; pulse width modulating the compensated signal to output the pulse width modulated signal.

Accordingly, the method and the apparatus for outputting the audio signal remove noise caused by drops of a source voltage.

In the above aspect of the present invention, the compensator may add the offset value to a value obtained by dividing the input signal by the source voltage, and an analogue digital converter may be connected between the power source and the compensator. In addition, a scaler or normalizer may be connected between the power source and the compensator, the input signal may be a pulse code modulated signal, a noise shaper may be connected between the compensator and the pulse width modulator, and the input signal input in the step of compensating the signal is a signal that is input during a burst period of a mobile communication terminal.

BRIEF DESCRIPTION OF THE DRAWINGS

The above and other features and advantages of the present invention will become more apparent by describing in detail exemplary embodiments thereof with reference to the attached drawings in which:

FIG. 2 is a block diagram illustrating an apparatus for outputting an audio signal according to another embodiment of the present invention;

DESCRIPTION OF EXEMPLARY EMBODIMENTS

Hereinafter, an apparatus for outputting an audio signal according to an embodiment of the present invention will be described.

Figure 1:
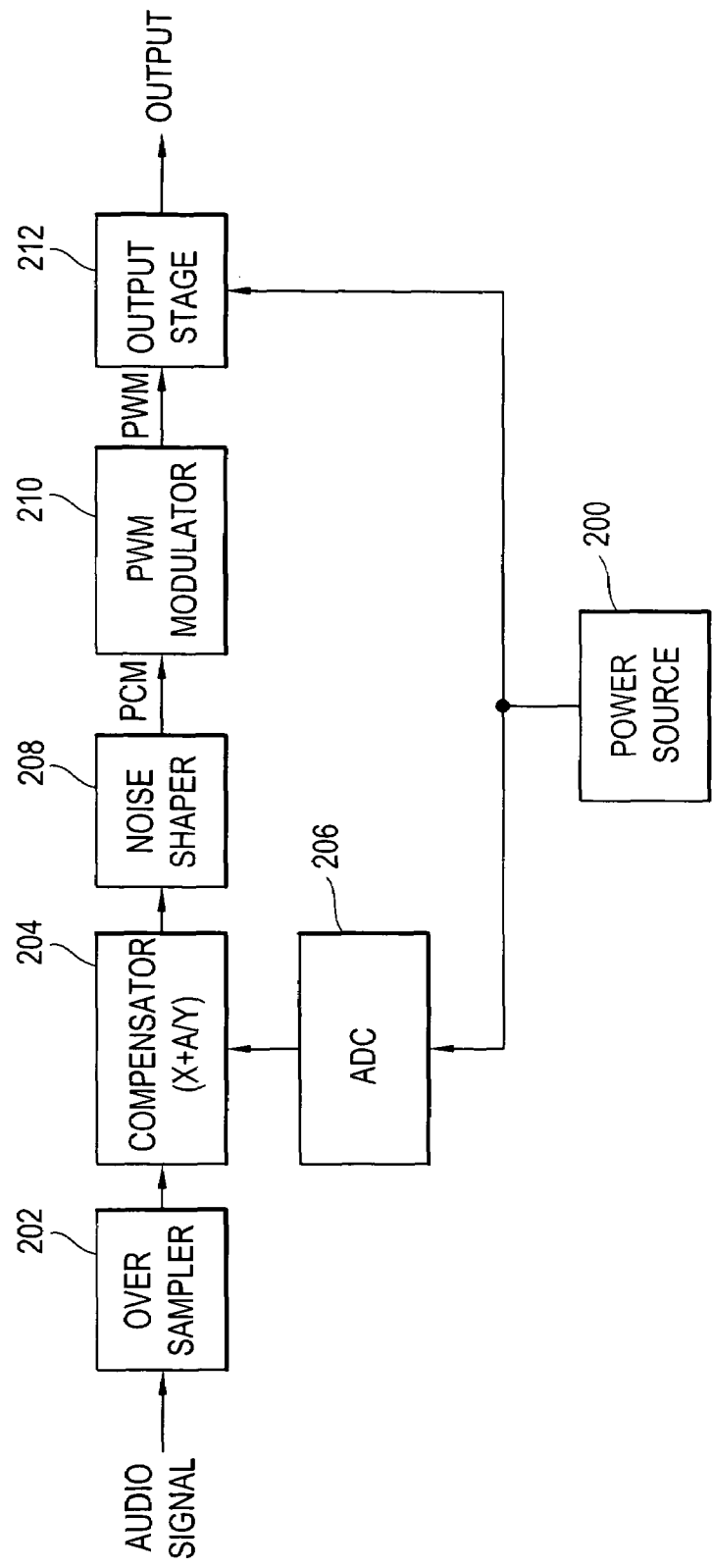
FIG. 1 is a block diagram illustrating an apparatus for outputting an audio signal according to an embodiment of the present invention.

FIG. 1 is a block diagram illustrating an apparatus for outputting an audio signal according to a first embodiment of the present invention. As shown in FIG. 1, the apparatus for outputting the audio signal according to an embodiment of the present invention includes a power source 200. The power source 200 supplies DC power. The power source 200 generates driving power and supplies the driving power to an output stage 212 and an AD converter 206. Then, a voltage drop occurs in the voltage supplied by the power source 200. The voltage drop periodically occurs whenever the audio signal is output.

The input audio signal is over sampled and pulse code modulated by an over sampler 202. The apparatus includes a compensator 204 which receives the pulse code modulated signal as an input signal and a voltage output from an AD converter 206.

The compensator 204 compensates the PCM signal according to a predetermined compensation equation. According to the compensation equation, the audio signal is compensated by adding the input signal to an offset value reciprocally proportional to the source voltage. The compensation equation will be described in detail in the following.

A noise shaper 208 may be connected to the output of the compensator 204. The noise shaper 208 attenuates the noise of the compensated PCM signal. A PWM modulator 210 is connected to the output of the noise shaper 208. The PWM modulator 210 modulates pulse width of the PCM signal to supply the pulse width modulated PCM signal to an output stage 212. Accordingly, the output stage 212 is connected to the output of the PWM modulator 210 and outputs the finally compensated digital audio signal.

FIG. 2 is a block diagram illustrating an apparatus for outputting an audio signal according to another embodiment of the present invention. In FIG. 2, a scaler 300 is connected between the AD converter 206 and the compensator 204. The scaler 300 may be connected between the power source 200 and the AD converter 206. A normalizer may be selectively connected to any location between the power source 200 and the compensator 204.

The scaler 300 is used to scale the output value of the power source, and the normalizer is used to normalize the output value of the power source. Specifically, when voltage drops are different depending on types of the apparatus for outputting the audio signal, the normalizer and the scaler 300 equalizes the voltage drops to suitably compensate the audio signal depending on the noise. In addition, when the voltage drops are abnormally high, the normalizer and the scaler 300 also have a function of suppressing a sharp compensation of the audio signal due to the voltage drop.

Hereinafter, a method of outputting an audio signal and a method of compensating the audio signal performed by the compensator 204 and the aforementioned compensation equation will be described.

Figure 3A:
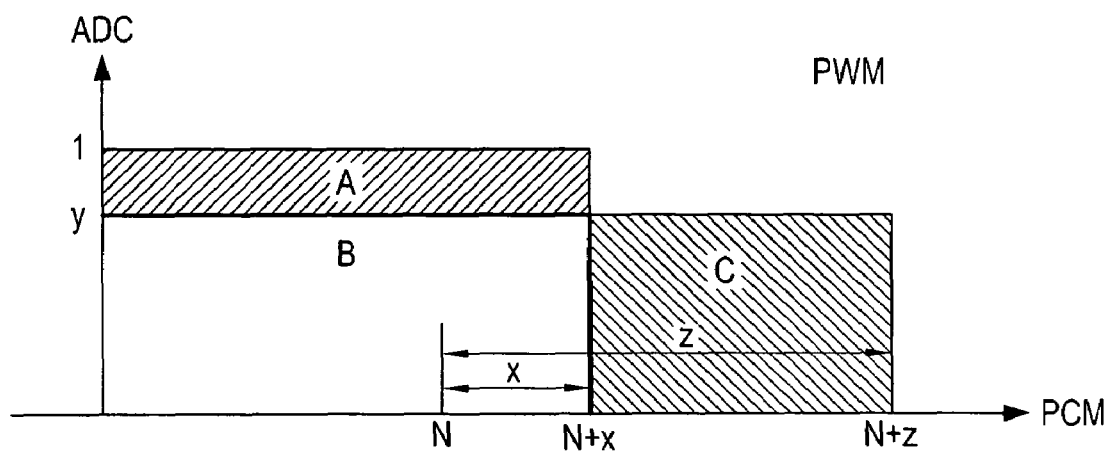
FIG. 3a is a view for illustrating a PWM area change due to a voltage drop.

FIG. 3a is a view for illustrating a PWM area change due to a voltage drop.

As shown in FIG. 3a, when a source voltage value input through an AD converter 206 is 1, the PWM area is $1 \times (N+x) = N+x$ with respect to a PCM signal x. Here, N is a PWM value corresponding to a duty ratio.

When a voltage drop occurs in a voltage supplied by the power source 200, that is, a voltage value input through the AD converter 206 decreases to y, the PWM area is $y \times (N+x)$ with respect to a PCM signal x.

That is, when the voltage drop occurs, and noise occurs in the audio signal, the PWM area decreases from A+B to B by A. Accordingly, in order to compensate for the reduced area and remove the noise, the PCM signal x is converted into a signal z so that the area of A is an area C.

Hereinafter, the compensation equation according to the embodiment of the present invention will be derived on the basis of the aforementioned area change. The compensated value z satisfies the area relation A+B=B+C. Accordingly, the compensated value z is derived by Equation 1.

$$1 \times (N+x) = y \times (N+z),$$

$$N+x = y \times N + y \times z,$$

$$N+x - y \times N = y \times z,$$

$$X + N \times (1-y) = y \times z \qquad \text{[Equation 1]}$$

According to Equation 1, the compensated value is defined by Equation 2.

$$Z = x/y + N \times (1-y)/y \qquad \text{[Equation 2]}$$

Here, as described above, N is the PWM value corresponding to a duty ratio. Accordingly, N is set as an offset value A that is a predetermined constant. When the voltage is dropped, the compensator 204 outputs the compensated PCM signal obtained by compensating the input PCM signal according to Equation 2.

Figure 3B:
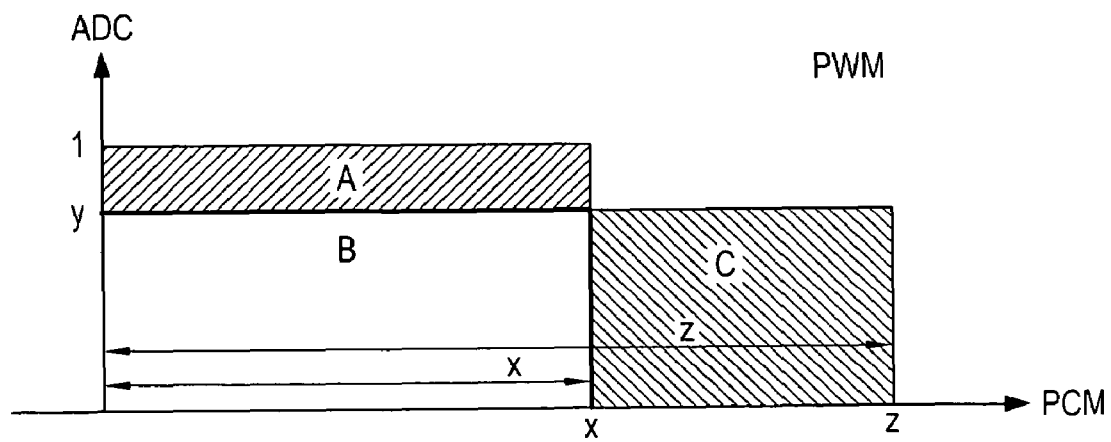
FIG. 3b is a view for illustrating a case where an equation z=x/y is applied to a PWM area change due to a voltage drop.

On the other hand, the compensation equation z=x/y in the U.S. Patent issued to Smedley is less effective as compared with the compensation equation according to the embodiment of the present invention. This is described by using the PWM area change, again. FIG. 3b is a view for illustrating a case where an equation z=x/y is applied to a PWM area change due to a voltage drop.

As shown in FIG. 3b, since the compensation equation z=x/y has to satisfies the equation A+B=B+C, z is obtained by an equation $1 \times x = y \times z$. However, a method of converting the PCM signal into the PWM signal is performed as shown in FIG. 3a. Specifically, the PWM signal increases or decreases by the duty ratio "N" of the PWM value as a center value with respect to the PCM signal x. That is, when x=0, the PWM signal is not zero but N.

Figure 3C:
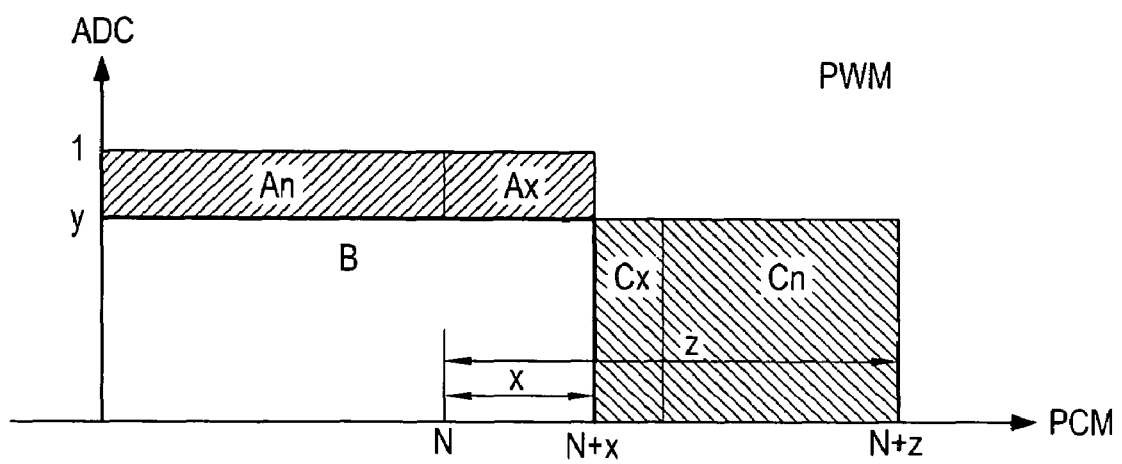
FIG. 3c is a view for illustrating a practical compensation relation in a case where an equation z=x/y is applied to a PWM area change due to a voltage drop.

It may be known how to perform compensation according to the equation z=x/y on the basis of the aforementioned description. FIG. 3c is a view for illustrating a practical compensation relation in a case where an equation z=x/y is applied to a PWM area change due to a voltage drop.

As shown in FIG. 3c, in case where the equation z=x/y is used for compensation, when the voltage drop practically occurs, the area $A_x$ is compensated by $C_x$, and the area $A_n$ is not compensated by $C_n$. That is, the compensation is not optimized. However, since the compensator 204 according to an embodiment of the present invention compensates $A_n$ in addition to $A_x$, it is possible to more effectively output the audio signal.

On the other hand, Equation 2 that is the compensation equation may be modified as another modified compensation equation. Hereinafter, the compensation equation according to a modified embodiment will be described.

$$z=x/y+A\times(1-y) \quad \text{[Equation 3]}$$

Equation 3 is obtained by omitting the 1/y operation from Equation 2. When the compensator is constructed by hardware, the structure of the compensator is simplified by Equation 3. When the compensator is constructed by software, the process of the compensator can be simplified by Equation 3.

$$z=x/y+A\times F(y), F(1)=0, \quad \text{[Equation 4]}$$

Here, y is a normalized value.

In Equation 4, when the normalized value y is 1, z is zero. Equation 4 employs a function reciprocally proportional to y, and Equation 4 is obtained by universalizing Equation 2.

$$z=x/(y/M)+A\times(1-(y/M))/(y/M) \quad \text{[Equation 5]}$$

$$z=x/(y/M)+A\times(1-y/M) \quad \text{[Equation 6]}$$

$$z=x/(y/M)+A\times F(y/M) \quad \text{[Equation 7]}$$

Equations 5 to 7 are obtained by dividing y by the normalized or scaled value of M. Since the voltage drops are different depending on the types of the apparatuses for outputting the audio signal, the audio signal can be suitably compensated by equalizing the voltage drops according to normalizing or scaling. In addition, when the voltage drops are abnormally high, a sharp compensation of the audio signal due to the voltage drop is limited by the normalizing or scaling.

$$z=x+A\times F(y/M) \quad \text{[Equation 8]}$$

$$z=x+A\times(1-y)/y \quad \text{[Equation 9]}$$

$$z=x+A\times F(y) \quad \text{[Equation 10]}$$

Here, F(1)=0, F(y) is a function of outputting a value reciprocally proportional to y, and y is a normalized value.

Equations 8 to 10 represents embodiments in which the operation of the compensation equation is simplified and x and y are not divided in order to compensate for the noise of the audio signal.

Hereinafter, exemplary embodiments of a method and an apparatus for outputting an audio signal of the present invention will be described in detail.

There are various multiple access methods in a digital mobile communication method. A time division multiple access method among the various multiple access methods is a method in which a predetermined frequency bandwidth is periodically divided into predetermined time intervals, and each user transmits its signal during the time interval allocated to each user by turns. The time interval is referred to as a burst period or time slot. On the other hand, in the TDMA method, noise occurs in the output stage 212 due to a time burst ripple during the burst period. Specifically, when information to be transmitted by a mobile communication terminal is output in high frequency, a power amplifier uses a pulse current of the power source with the maximum current of 2.5 Ampere during the time slop (557us).

The process is repeatedly performed every 4.615 ms during the transmission. On the other hand, a voltage level is also influenced by the burst. When the power source is a lithium ion battery, a serial resistance is 120 mΩ(ohm) at the worst case. Accordingly, a voltage drop of 300 mV (120 mV×2.5) occurs during 557 us.

Figure 4A:
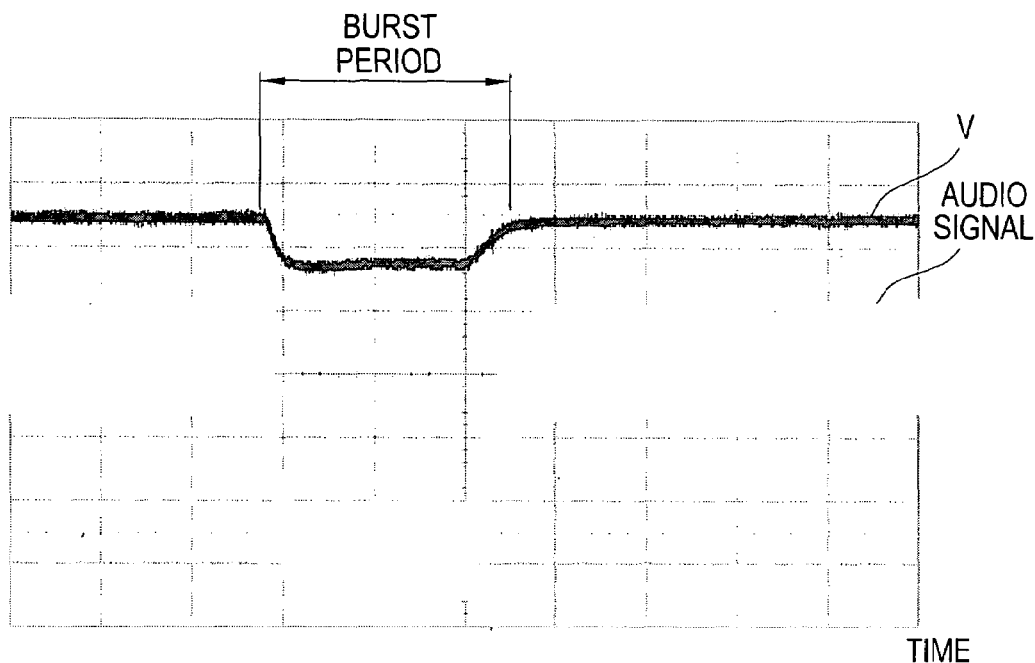
FIG. 4a is a graph for illustrating a voltage drop and au audio signal change when the audio signal is output according to a prior art.

FIG. 4a is a graph for illustrating a voltage drop and au audio signal change when the audio signal is output according to prior art. As shown in FIG. 4a, when the drop of the voltage $C_1$ occurs during the burst period, the level of the PCM signal $C_2$ also drops. When the audio signal is output, noise occurs due to the drop of the PCM signal level.

Figure 5A:
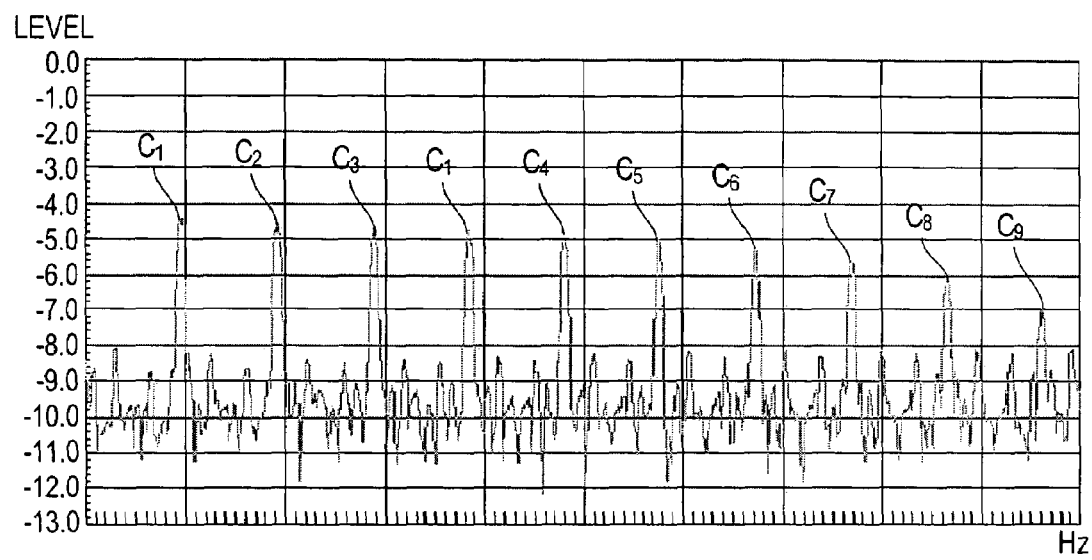
FIG. 5a shows a frequency spectrum of a ripple when an audio signal is output according to a prior art.

FIG. 5a shows a frequency spectrum of a ripple when an audio signal is output according to an existing method. As shown in FIG. 5a, the frequency of the first spectrum is 217 Hz that is obtained by converting the time period of 4.615 ms into a frequency value (1/4.615 ms=217 Hz). Here, the magnitude of the first spectrum $C_1$ is proportional to the voltage drop shown in FIG. 4a, and $C_2$ to $C_9$ are harmonic components of $C_1$.

Figure 4B:
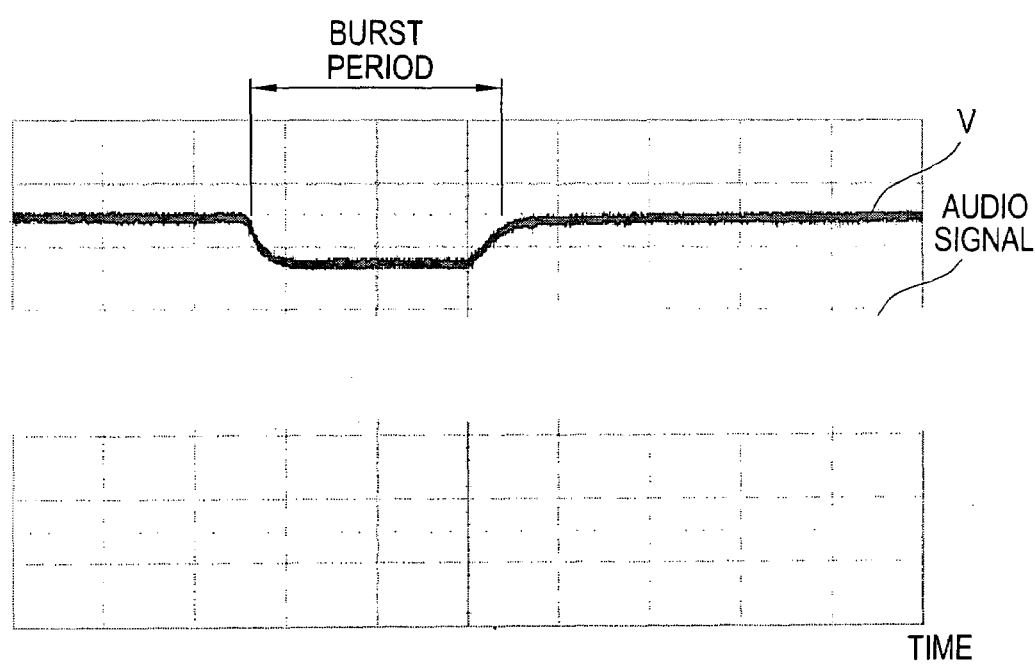
FIG. 4b is a graph for illustrating a voltage drop and an audio signal change when the audio signal is output according to an embodiment of the present invention.
Figure 5B:
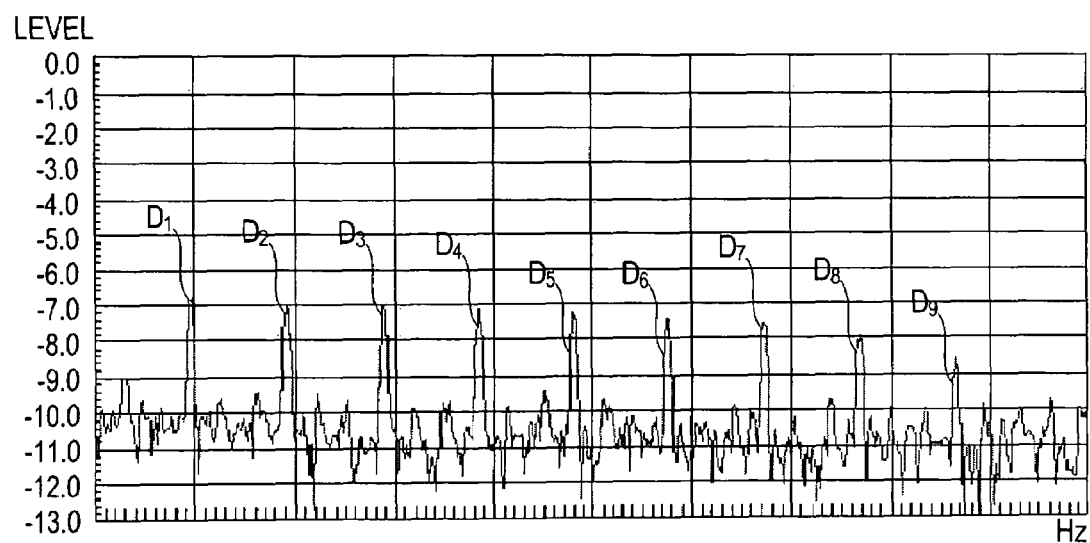
FIG. 5b shows a frequency spectrum of a ripple when an audio signal is output according to an embodiment of the present invention.

FIG. 4b is a graph for illustrating a voltage drop and an audio signal change when the audio signal is output according to an embodiment of the present invention. FIG. 5b shows a frequency spectrum of a ripple when an audio signal is output according to an embodiment of the present invention.

In the compensation result obtained by using the compensation method according to an embodiment of the present invention, even when the voltage $C_1$ drops as shown in FIG. 4b, the PCM signal $C_2$ in the TDMA burst period partially reacts with the voltage drop immediately before and immediately after the burst period, however the level of the signal does not drop. Specifically, since the PCM signal is compensated by a value reciprocally proportional to the voltage drop, the audio signal is compensated even during the burst period despite the voltage drop.

As shown in FIG. 5b, the harmonic components $D_2$ to $D_9$ in addition to the frequency of the first spectrum $D_1$ of the ripple during the burst period are concurrently decreased. As the sampling frequency and the input bit number increase, the AD converter 206 can sharply decrease the level of the frequency component.

As described above, the method and the apparatus for outputting the audio signal according to an embodiment of the present invention may be applied to various output apparatuses for outputting the digital audio signal by those of ordinary skill in the art, and the compensation equation may be partially modified and applied. However, when the modified compensation equation or another embodiment includes the sprit of the present invention, the modified compensation equation or another embodiment is within the scope of the present invention.

In the aforementioned method and the apparatus for outputting the audio signal according to the present invention, audio quality can be improved directly for a listener by removing the noise caused by the voltage drop.

What is claimed is:

1. An apparatus for outputting an audio signal comprising:
   a power source;
   a compensator for compensating an input signal by adding the input signal to an offset value reciprocally proportional to a source voltage;
   a pulse width modulator for modulating an audio signal transmitted from the compensator; and
   an output stage for outputting the modulated audio signal.

2. The apparatus of claim 1, wherein the compensator adds the offset value to a value obtained by dividing the input signal by the source voltage.

3. The apparatus of claim 1, wherein an analogue digital converter is connected between the power source and the compensator.

4. The apparatus of claim 1, wherein a scaler or normalizer is connected between the power source and the compensator.

5. The apparatus of claim 1, wherein the input signal is a pulse code modulated signal.

6. The apparatus of claim 1, wherein a noise shaper is connected between the compensator and the pulse width modulator.

7. The apparatus of claim 1, wherein the compensator compensates the input signal according to the following compensation equation:

$$z=x/y+A\times(1-y)/y$$

wherein z is a compensated value, x is the input signal, A is the offset value, and y is a value obtained by AD converting the source voltage.

8. The apparatus of claim 1, wherein the compensator compensates the input signal according to the following compensation equation:

$$z=x/y+A\times(1-y)$$

wherein z is a compensated value, x is the input signal, A is the offset value, and y is a value obtained by AD converting the source voltage.

9. The apparatus of claim 1, wherein the compensator compensates the input signal according to the following compensation equation:

$$z=x/y+A\times F(y)$$

wherein z is a compensated value, x is the input signal, A is the offset value, y is a value obtained by AD converting the source voltage, F(y)=0 when y is 1, and y is a normalized value.

10. The apparatus of claim 1, wherein the compensator compensates the input signal according to the following compensation equation:

$$z=x+A\times(1-y)/y$$

wherein z is a compensated value, x is the input signal, A is the offset value, and y is a value obtained by AD converting the source voltage.

11. The apparatus of claim 1, wherein the compensator compensates the input signal according to the following compensation equation:

$$z=x+A\times(1-y)$$

wherein z is a compensated value, x is the input signal, A is the offset value, and y is a value obtained by AD converting the source voltage.

12. The apparatus of claim 1, wherein the compensator compensates the input signal according to the following compensation equation:

$$z=x+A\times F(y)$$

wherein z is a compensated value, x is the input signal, A is the offset value, F(y)=0 when y is 1, and y is a normalized value.

13. The apparatus of claim 1, wherein the input signal input into the compensator is a signal that is input during a burst period of a mobile communication terminal.

14. A method of outputting an audio signal, the method comprising steps of:

compensating an input signal by adding a value reciprocally proportional to a source voltage to the input signal;

pulse width modulating the compensated signal to output the pulse width modulated signal.

15. The method of claim 14, wherein the source voltage is scaled or normalized.

16. The method of claim 14, wherein in the step of compensating the signal, the offset value is added to a value obtained by dividing the input signal by the voltage.

17. The method of claim 14, wherein the input signal is a pulse code modulated signal.

18. The method of claim 14, wherein in the step of compensating the signal, the input signal is compensated by the following compensation equation:

$$z=x/y+A\times(1-y)/y$$

wherein z is a compensated value, x is the input signal, A is the offset value, and y is a value obtained by AD converting the source voltage.

19. The method of claim 14, wherein in the step of compensating the signal, the input signal is compensated by the following compensation equation:

$$z=x/y+A\times(1-y)$$

wherein z is a compensated value, x is the input signal, A is the offset value, and y is a value obtained by AD converting the source voltage.

20. The method of claim 14, wherein in the step of compensating the signal, the input signal is compensated by the following compensation equation:

$$z=x/y+A\times F(y)$$

wherein z is a compensated value, x is the input signal, A is the offset value, y is a value obtained by AD converting the source voltage, F(y)=0 when y is 1, and y is a normalized value.

21. The method of claim 14, wherein in the step of compensating the signal, the input signal is compensated by the following compensation equation:

$$z=x+A\times(1-y)/y$$

wherein z is a compensated value, x is the input signal, A is the offset value, and y is a value obtained by AD converting the source voltage.

22. The method of claim 14, wherein in the step of compensating the signal, the input signal is compensated by the following compensation equation:

$$z=x+A\times(1-y)$$

wherein z is a compensated value, x is the input signal, A is the offset value, and y is a value obtained by AD converting the source voltage.

23. The method of claim 14, wherein in the step of compensating the signal, the input signal is compensated by the following compensation equation:

$$z=x+A\times F(y)$$

wherein z is a compensated value, x is the input signal, A is the offset value, y is a value obtained by AD converting the source voltage, F(y)=0 when y is 1, and y is a normalized value.

24. The method of claim 14, wherein the input signal input in the step of compensating the signal is a signal that is input during a burst period of a mobile communication terminal.

* * * * *